(12) United States Patent
Fan et al.

(10) Patent No.: US 8,006,203 B2
(45) Date of Patent: Aug. 23, 2011

(54) BULK IMAGE MODELING FOR OPTICAL PROXIMITY CORRECTION

(75) Inventors: Yongfa Fan, San Jose, CA (US); Qiaolin Zhang, Mountain View, CA (US); Bradley J. Falch, Round Rock, TX (US)

(73) Assignee: Synopsys, Inc., Mountain View, CA (US)

( * ) Notice: Subject to any disclaimer, the term of this patent is extended or adjusted under 35 U.S.C. 154(b) by 310 days.

(21) Appl. No.: 12/200,523

(22) Filed: Aug. 28, 2008

(65) Prior Publication Data

US 2010/0058280 A1    Mar. 4, 2010

(51) Int. Cl.
G06F 17/50 (2006.01)
G06F 19/00 (2011.01)
G03F 1/00 (2006.01)
G21K 5/00 (2006.01)
G06K 9/00 (2006.01)

(52) U.S. Cl. ............. 716/54; 716/55; 716/51; 716/111; 716/136; 700/98; 700/121; 700/120; 430/5; 378/35; 382/144; 382/145; 382/154

(58) Field of Classification Search ................ 716/4, 19, 716/51, 54, 55, 111, 136; 700/98, 120, 121; 430/5; 378/35; 382/144, 145, 154
See application file for complete search history.

(56) References Cited

U.S. PATENT DOCUMENTS

| 5,633,713 | A | * | 5/1997 | Tanaka et al. ................. 356/521 |
| 7,117,475 | B2 | | 10/2006 | Croffie |
| 7,302,090 | B2 | | 11/2007 | Kalus et al. |
| 7,324,930 | B2 | | 1/2008 | Cobb |
| 2006/0172227 | A1 | * | 8/2006 | Shaarawi et al. ............. 430/311 |
| 2008/0201686 | A1 | | 8/2008 | Zhang |

OTHER PUBLICATIONS

Lian, Hongmei, et al., Variable Threshold Optical Proximity Correction (OPC) Models for High Performance 0.18μm Process, Optical Lithography XIII, Chistopher J. Progler, Editor, Proceedings of SPIE vol. 4000 (2000), pp. 1033-1040.
"ProGen Basic Training" Synopsys, Hillsoboro Oregon, Sep. 10-11, 2007, 121 pages.
Yu, Peng, et al., "True Process Variation Aware Optical Proximity Correction with Variational Lithography Modeling and Model Calibration," Journal of Micro/Nanolithography, MEMS/MEOMS Jul. 2007.
International Search Report for PCT/US2009/052361 mailed Mar. 16, 2010.

* cited by examiner

*Primary Examiner* — Phallaka Kik
(74) *Attorney, Agent, or Firm* — Haynes Beffel & Wolfeld LLP

(57) ABSTRACT

A method is described herein for predicting lateral position information about a feature represented in an integrated circuit layout for use with an integrated circuit fabrication process, where the process projects an image onto a resist. The method includes providing a lateral distribution of intensity values of the image at different depths with the resist. Next, the lateral position of an edge point of the feature is predicted in dependence upon a particular resist development time, and further in dependence upon the image intensity values at more than one depth within the resist.

54 Claims, 11 Drawing Sheets

BULK IMAGE MODELING FOR OPTICAL PROXIMITY CORRECTION

BACKGROUND OF THE INVENTION

1. Field of the Invention

The present invention relates to integrated circuit design and fabrication, and more particularly to methods for predicting positional information about a feature in an integrated circuit layout.

2. Description of Related Art

In photolithography, features are created on an integrated circuit or other device by exposing a mask pattern (As used herein, the term "mask" includes the term "reticle") to project an image onto a wafer that is coated with light sensitive materials. After exposure, the wafer is chemically and mechanically processed to create the features defined by the exposure pattern.

As the features created on a wafer become increasingly small, optical and other process distortions occur in which the desired features to be created on a wafer do not match the actual features created on the wafer. Examples of deviations include corner-rounding, line-end shortening, etc., which can significantly degrade the functional performance of the desired features. To compensate for the distortions, many photolithographic processes use one or more resolution enhancement techniques (RET) to improve the pattern fidelity with which the desired pattern is printed on the wafer.

In most resolution enhancement techniques such as optical and proximity correction (OPC), a simulation is made of how a feature will print on a wafer. The simulation is then used to adjust a pattern contained on a mask or reticle in a way that compensates for the expected distortions. Despite the name, OPC typically also includes pre-correction of other undesirable pattern distortions unrelated to the optical image transfer such as those caused by mask manufacturing and etching processes.

As part of the simulation, a resist model can be used that predicts how the resist materials will behave when exposed with a particular mask pattern.

OPC resist models are typically based on a "threshold model" which makes the approximation that any point at a fixed depth in the resist that receives an incident amount of energy above some threshold value will either develop away, or remain, depending on whether the photoresist is positive or negative. These resist models include "variable threshold models" in which the model threshold value depends upon the environment of the feature.

It has been observed that current OPC modeling methods are accurate at predicting the effects of optics, but have only fair accuracy at predicting resist behavior because complex resist behavior including effects such as vertical diffusion, development rate effects, resist thickness impact, inhibition layer impact, etc. cannot be accurately accounted for in the "threshold" resist models.

Thus in calibration the optical model parameters are often distorted to match the behavior of the resist response, which lowers model predictability and is very computationally and human resource inefficient.

It is therefore desirable to provide more accurate methods for modeling resist behavior which are computationally efficient and can be used for use with OPC.

SUMMARY OF THE INVENTION

A method is described herein for predicting lateral position information about a feature, such as a resist feature or a feature in a layer underlying a layer of resist, represented in an integrated circuit layout for use with an integrated circuit fabrication process, where the process projects an image onto a resist. The method includes providing a lateral distribution of intensity values of the image at different depths within the resist. Next, the lateral position of an edge point of the feature is predicted in dependence upon a particular resist development time, and further in dependence upon the image intensity values at more than one depth within the resist.

In one embodiment the lateral position information about the feature is determined by first estimating the required time t(x,y) to develop from the top of the resist to the bottom of the resist at each of the lateral positions (x,y) and is computed using the following equation:

$$t(x, y) = \int_0^{Z_T} \frac{dz}{c(z)[I(x, y, z)]^\gamma}$$

wherein $Z_T$ is the thickness of the resist, $c(z)$ is an empirically determined weighting function, $\gamma$ is a constant, and $I(x,y,z)$ is the image intensity values at each $(z)$ position of the lateral position $(x,y)$ of an image projected onto a resist. Next, a particular resist development time $t_{dev}$ is applied to the time development function $t(x,y)$ to determine the lateral positions of the contour of the resultant resist feature.

A system is described herein for predicting lateral position information about a feature represented in an integrated circuit layout for use with an integrated circuit fabrication process, where the process projects an image onto a resist. The system comprises a data processor, a storage subsystem, and program code. The program code, when executed by the data processor, performs the step of providing a lateral distribution of intensity values of the image at different depths within the resist, and predicts a lateral position of an edge point of the feature in dependence upon a particular resist development time, and further in dependence upon the intensity values at more than one depth within the resist.

The methods and systems described use a resist model disclosed herein which creates a novel physically based algorithm of the complex behavior of the resist development which incorporates observed complex resist behavior. The resist model can be implemented as part of OPC and can be empirically matched to experimental results with high precision by regressions of only a few tunable parameters. The resist model has been shown to be at least as accurate as many other resist models as well being much faster than current OPC resist models.

Other aspects and advantages of the present invention can be seen on review of the drawings, the detailed description, and the claims which follow.

DETAILED DESCRIPTION

Figure 1:
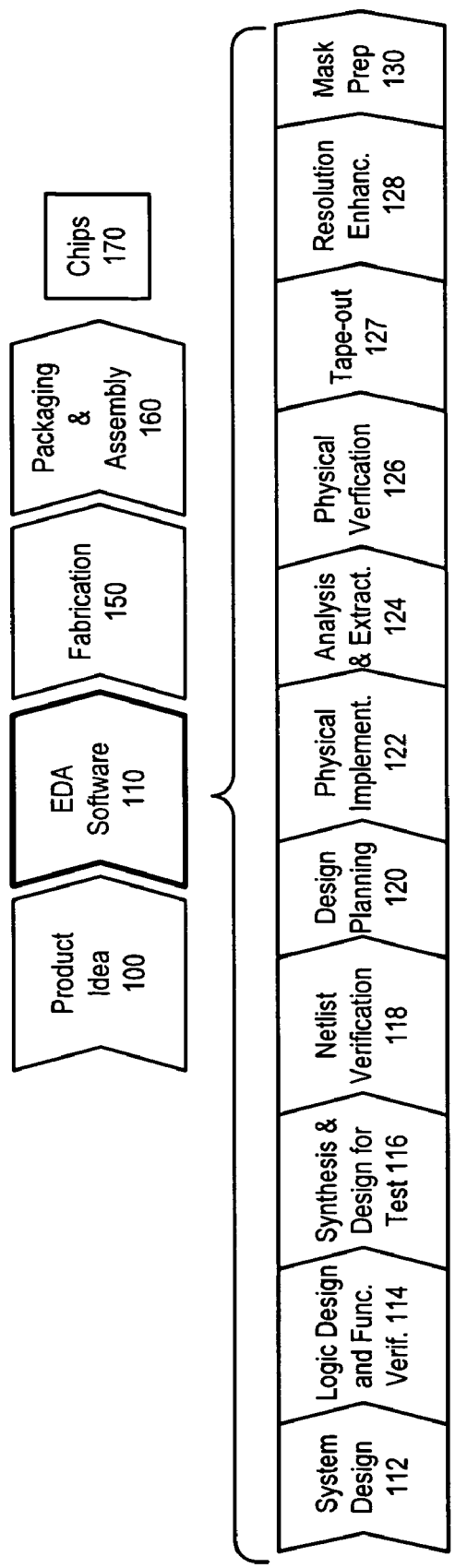
FIG. 1 shows a simplified representation of an illustrative integrated circuit design flow.

FIG. 1 shows a simplified representation of an illustrative integrated circuit design flow. As with all flowcharts herein, it will be appreciated that many of the steps of FIG. 1 can be combined, performed in parallel or performed in a different sequence without affecting the functions achieved. In some cases a re-arrangement of steps will achieve the same results only if certain other changes are made as well, and in other cases a re-arrangement of steps will achieve the same results only if certain conditions are satisfied. Such re-arrangement possibilities will be apparent to the reader.

At a high level, the process of FIG. 1 starts with the product idea (step 100) and is realized in an EDA (Electronic Design Automation) software design process (step 110). When the design is finalized, the fabrication process (step 150) and packaging and assembly processes (step 160) occur resulting, ultimately, in finished integrated circuit chips (result 170).

The EDA software design process (step 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the components steps of the EDA software design process (step 110) will now be provided.

System design (step 112): The designers describe the functionality that they want to implement, they can perform what-if planning to refine functionality, check costs, etc. Hardware-software architecture can occur at this stage. Example EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that produces the correct outputs in response to particular input stimuli. Example EDA software products from Synopsys, Inc. that can be used at this step include VCS, VERA, Design-Ware®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Complier, FPGA Compiler, TetraMAX, and DesignWare® products.

Netlist verification (step 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (step 120): Here, an overall floor plan for the chip is constructed and analyzed for timing and top-level routing. Example EDA software products from Synopsys, Inc. that can be used at this step include Astro and IC Compiler products.

Physical implementation (step 122): The placement (positioning of circuit elements) and routing (connection of the same) occurs at this step. Example EDA software products from Synopsys, Inc. that can be used at this step include AstroRail, Primetime, and Star RC/XT products.

Analysis and extraction (step 124): At this step, the circuit function is verified at a transistor level, this in turn permits what-if refinement. Example EDA software products from Synopsys, Inc. that can be used at this step include AstroRail, PrimeRail, Primetime, and Star RC/XT products.

Physical verification (step 126): At this step various checking functions are performed to ensure correctness for: manufacturing, electrical issues, lithographic issues, and circuitry. Example EDA software products from Synopsys, Inc. that can be used at this step include the Hercules product.

Tape-out (step 127): This step provides the "tape-out" data for production of masks for lithographic use to produce finished chips. Example EDA software products from Synopsys, Inc. that can be used at this step include the CATS(R) family of products.

Resolution enhancement (step 128): This step involves geometric manipulations of the layout to improve manufacturability of the design. Example EDA software products from Synopsys, Inc. that can be used at this step include Proteus/ProGen, ProteusAF, and PSMGen products.

Mask preparation (step 130): This step includes both mask data preparation and the writing of the masks themselves. Example EDA software products from Synopsys, Inc. that can be used at this step include CATS(R) family of products.

Embodiments of the present invention can be used during one or more of the above-described steps. Specifically, embodiments of the present invention can be used during the step of resolution enhancement (step 128).

Resist Development Model

As described above, it is desirable to provide more accurate methods for modeling resist behavior for use with OPC.

Figure 2:
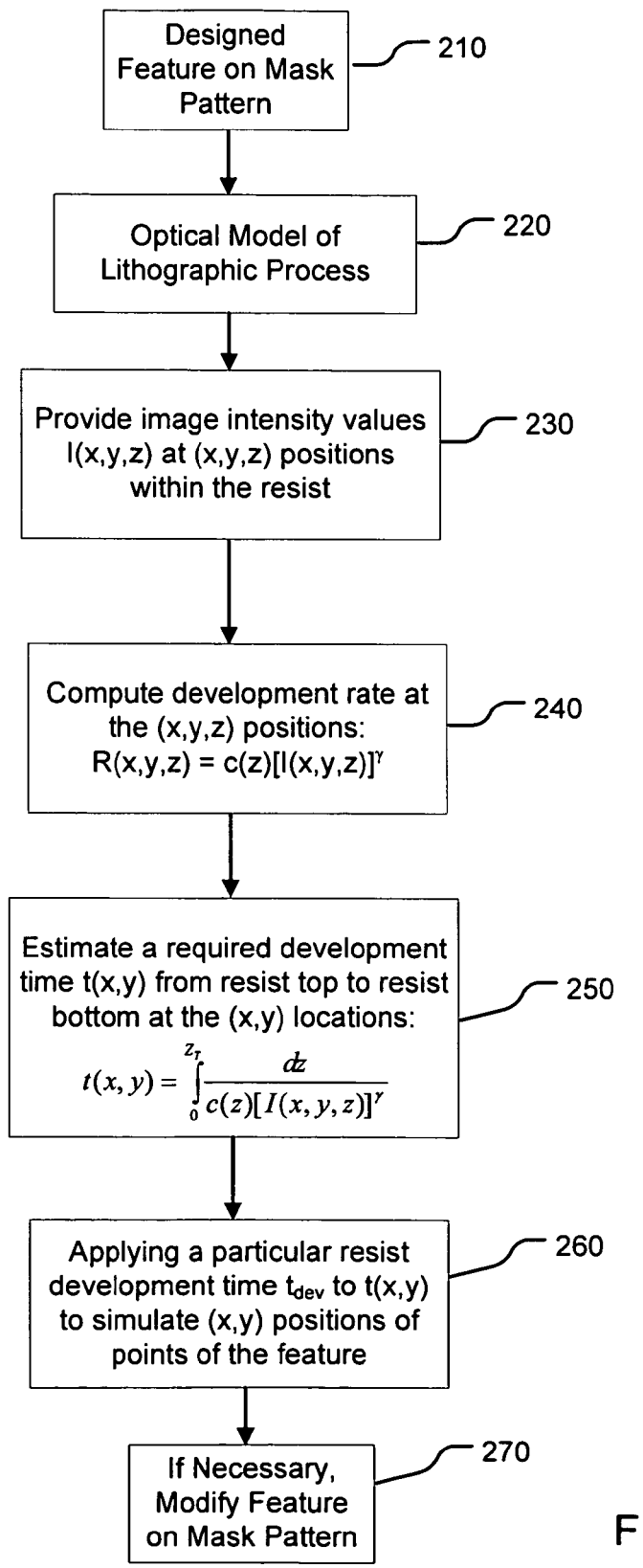
FIG. 2 is a flow chart for predicting lateral position information about a resist feature that will be formed during photolithographic exposure and development using a resist model as described herein.

FIG. 2 is a flow chart for predicting lateral position information about a resist feature that will be formed during photolithographic exposure and development using a resist model as described herein.

Figure 3:
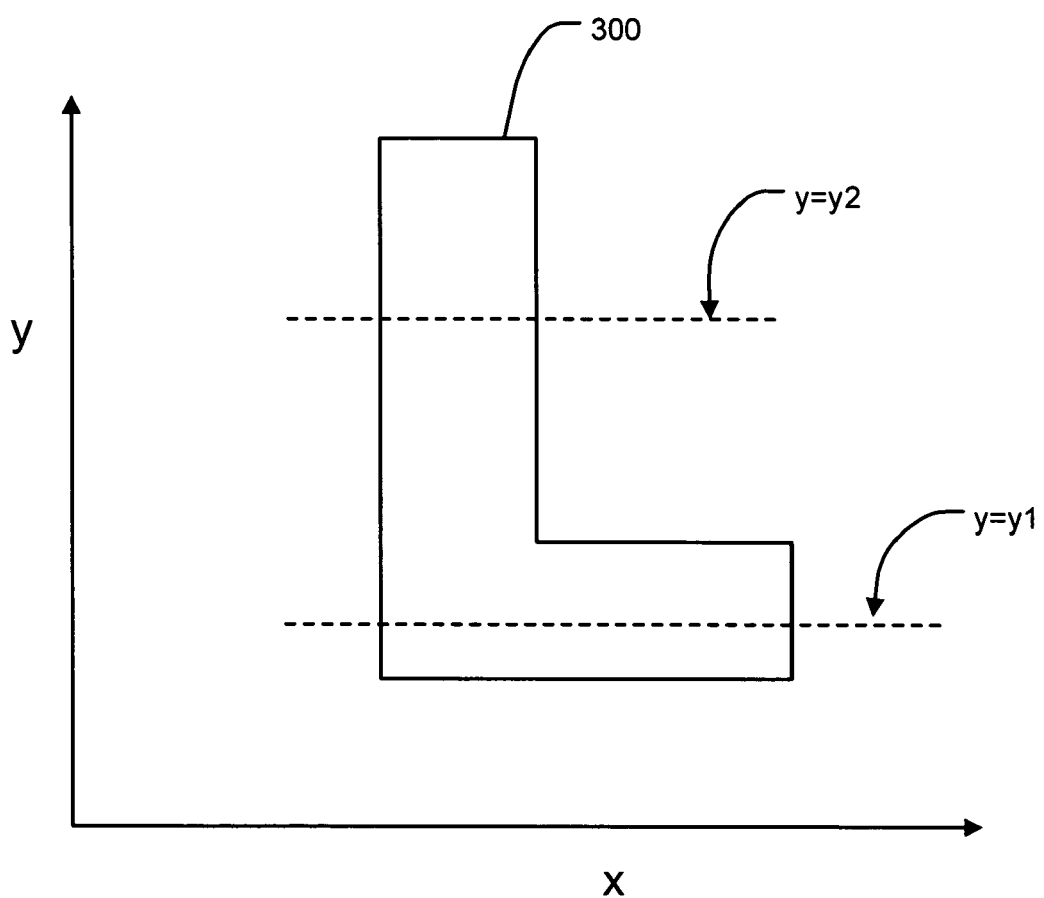
FIG. 3 is a plan view of an example designed feature on a mask pattern.
Figure 4:
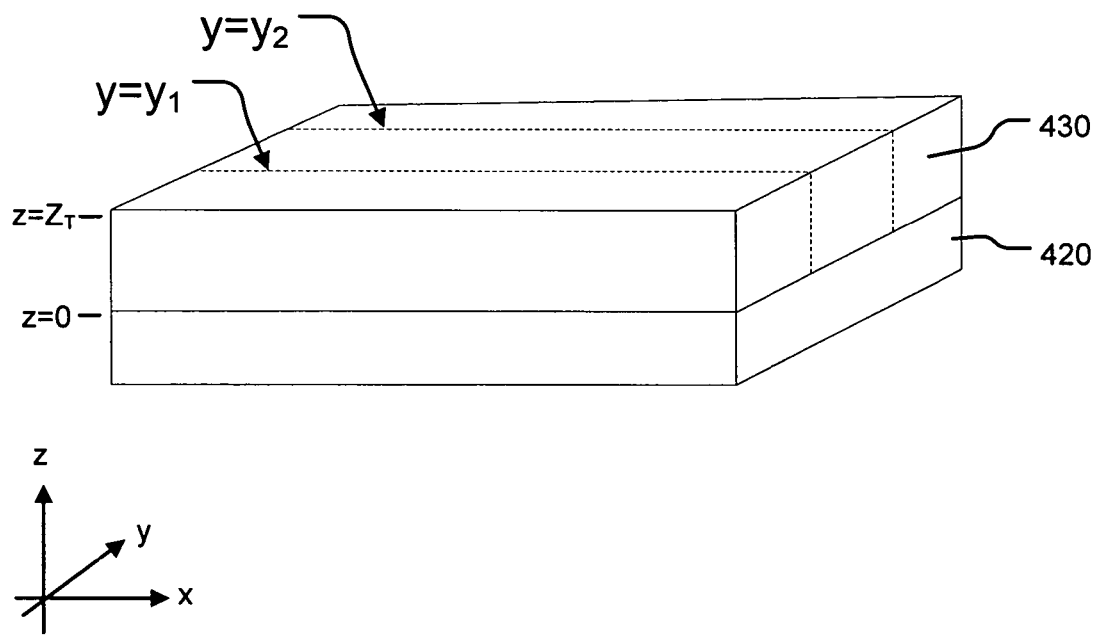
FIG. 4 illustrates a three-dimensional view of a layer of resist on an underlying layer.

FIG. 3 is a plan view of an example designed feature 300 on a mask pattern (block 210). At block 220, the designed feature 300 is supplied to an optical model of a lithographic process which simulates the projection of an image of the design feature 300 onto resist 430 of FIG. 4. As shown in FIG. 4, resist 430 has a thickness $Z_T$ and is on an underlying layer 420.

At block 230 the optical model of block 220 provides simulated image intensity values $I(x,y,z)$ of the image at $(x,y,z)$ positions with the resist. The image intensity values $I(x,y,z)$ can be located at discrete $(x,y,z)$ locations within the resist, or in some embodiments the image intensity values $I(x,y,z)$ can be a continuous function along the $(z)$ direction.

The image intensity values I(x,y,z) within the resist 430 can be provided using an optical model of the lithography process generated, for example, by the ProGen software produced by Synopsys Inc. The ProGen software allows for the description of characteristics of, among other things, optical system parameters (source illumination, projection pupil, etc.), mask parameters (transmission and phase, etc.), and wafer and resist film parameters (optical and dielectric constants, film thickness, etc.). The image intensity values I(x,y,z) within the resist can also be provided using other software and/or provided using other techniques.

Figure 5:
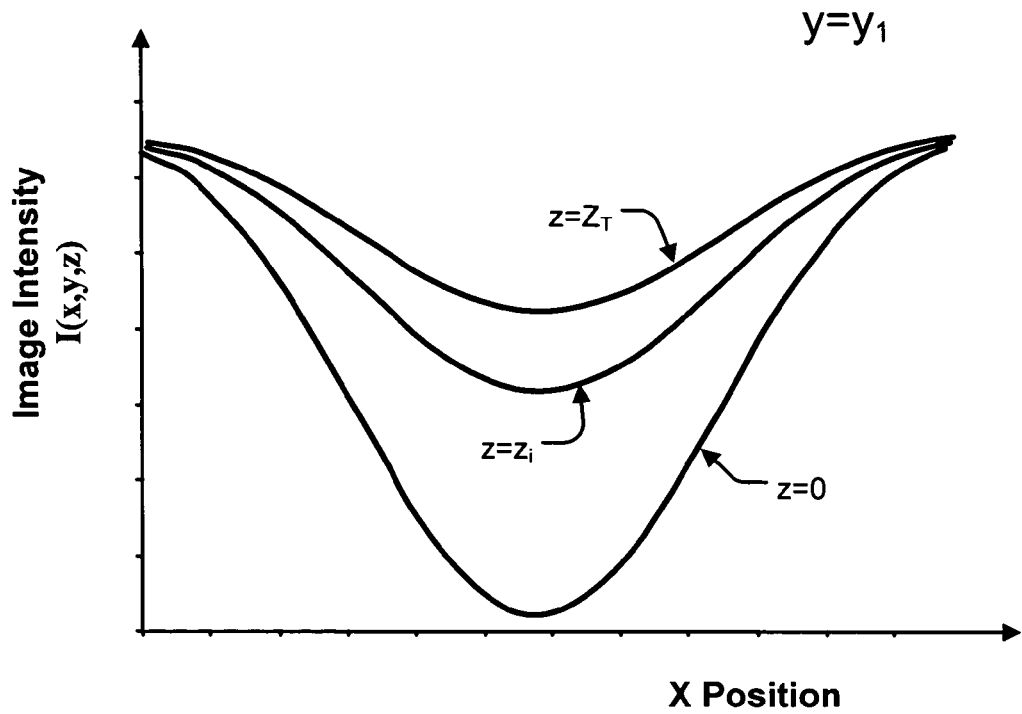
FIGS. 5 and 6 illustrate example plots of image intensity values I(x,y,z) of the projected image of the desired features at various depths within the resist at cross-sections taken along the x-axis at $y=y_1$ and $y=y_2$ respectively.
Figure 6:
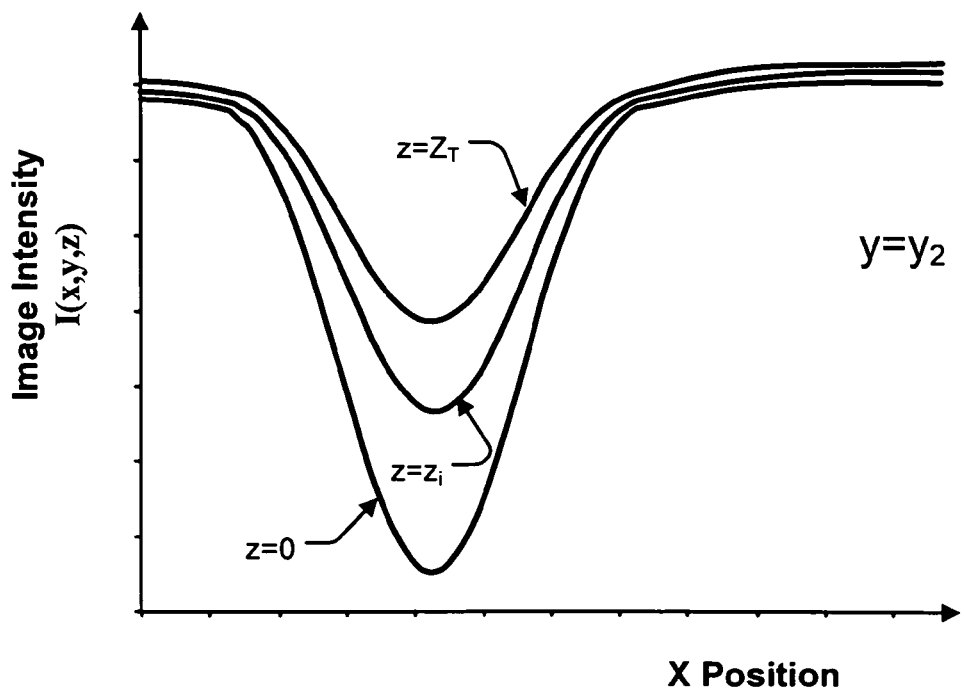

FIGS. 5 and 6 illustrate example plots of image intensity values I(x,y,z) of the projected image of the desired feature 300 at various depths (z) within the resist 430 at cross-sections taken along the x-axis at $y=y_1$ and $y=y_2$ respectively. For ease of illustrative purposes the image intensity values I(x,y,z) in FIGS. 5 and 6 are only shown at the top of the resist ($z=Z_T$), an intermediate depth ($z=z_i$) within the resist, and at the bottom of the resist ($z=0$), although it will be understood that typically the image intensity values I(x,y,z) can be provided at many more depths within the resist 430. Additionally, although the image intensity values I(x,y,z) are shown as continuous curves in FIGS. 5 and 6, the image intensity values may alternatively be provided at discrete (x,y,z) locations within the resist 430.

Referring back to FIG. 2, at block 240 the development rate at the (x,y,z) positions within the resist are calculate using the following equation:

$$R(x,y,z) = c(z)[I(x,y,z)]^\gamma$$

where I(x,y,z) is the image intensity value at the particular (x,y,z) position within the resist, γ is a constant representing resist contrast that may be determined empirically, and c(z) is an empirical weighting function independent of the lateral position (x,y) and described in more detail below. The weighting function c(z) can account for complex resist behavior which play a part in the resulting developed resist such as resist surface inhibition, developer mass transport, HDMS poisoning, vertical resist diffusion, substrate footing, etc. In the illustrated embodiment the development rate R(x,y,z) at each (x,y,z) location is calculated as the product of c(z) and $[I(x,y,z)]^\gamma$. Alternatively, other functions of the intensity value I(x,y,z) can be used in the computation of the development rate R(x,y,z). Thus, in some embodiments the development rate function equation can take on a more general form:

$$R(x,y,z) = c(z)f(I(x,y,z))$$

where f(I(x,y,z)) is a function of the intensity value I(x,y,z) at the particular (x,y,z) point.

Next, at block 250 a development time function t(x,y) is computed at each of the lateral positions (x,y). The development time function t(x,y) is the estimated time required to develop the resist from the resist top ($z=Z_T$) to the resist bottom (z=0) at each lateral position (x,y), and in the illustrated embodiment is computed using the following equation:

$$t(x, y) = \int_0^{Z_T} \frac{dz}{c(z)[I(x, y, z)]^\gamma}$$

In the development time function t(x,y) of the illustrated embodiment, t(x,y) at each lateral position (x,y) is dependent upon an integral from the bottom of the resist (z=0) to the top of the resist ($z=Z_T$) of the inverse of the product of c(z) and the development rate. In alternative embodiments the development time function t(x,y) at each lateral position (x,y) can be computed in dependence upon a sum of the inverse of the product of $c(z_i)$ and the development rate at each ($z_i$) depth using the following equation:

$$t(x, y) = \sum_{i=0}^{n} \frac{(Z_T/n)}{c(z_i)[I(x, y, z_i)]^\gamma}$$

where $Z_T$ is a thickness of the resist at the particular point, and $I(x,y,z_i)$ is the intensity value at the particular lateral position (x,y) at each of (n+1) different depths ($z_i$) within the resist.

Figure 7:
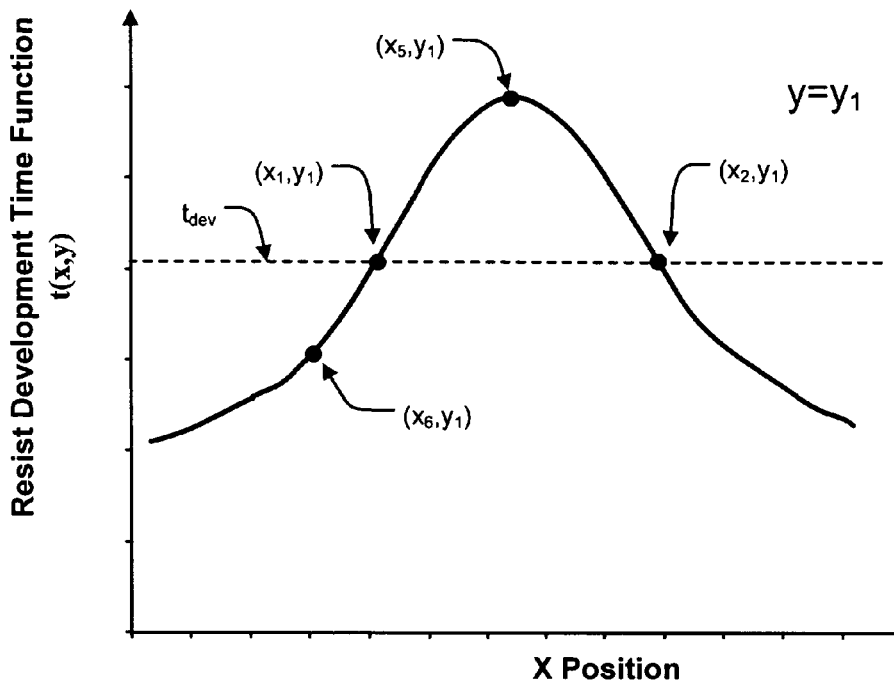
FIGS. 7 and 8 illustrate the required development time $t(x,y)$ for the lateral positions $(x,y)$ of the image intensity values $I(x,y,z)$ shown in the cross-section of FIGS. 5 and 6.
Figure 8:
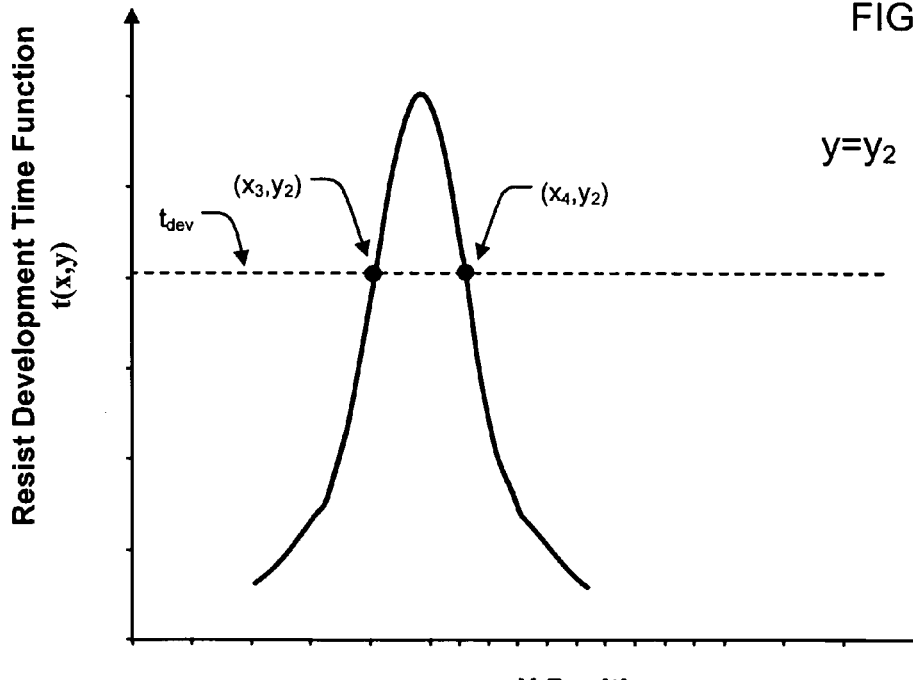

FIGS. 7 and 8 illustrate the required development time t(x,y) of the image intensity values I(x,y,z) shown in the cross-section of FIGS. 5 and 6 respectively.

Figure 9:
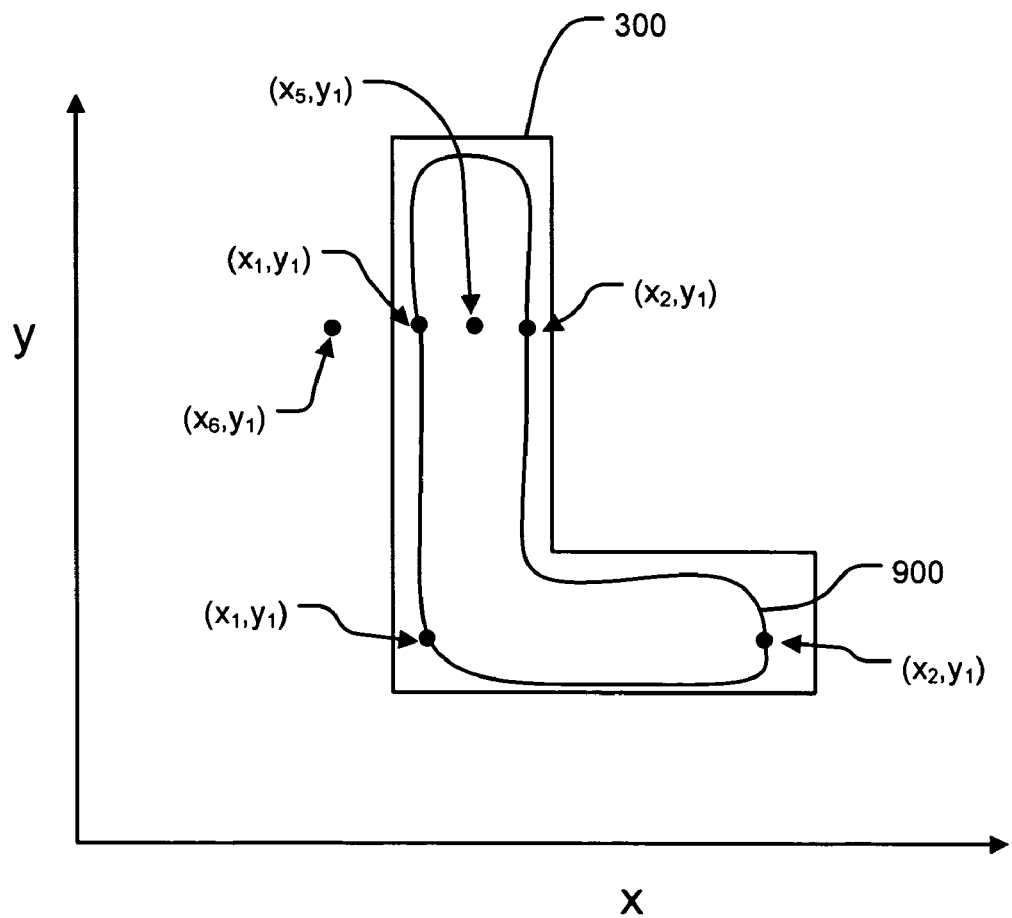
FIG. 9 illustrates the resulting contour of the resist feature using the resist model described herein.

Next, (block 260) a particular resist development time $t_{dev}$ of the simulated lithographic process is applied to the time development function t(x,y) to simulate the lateral positions of the contour of the resultant resist feature 900 of FIG. 9. Since the development time function t(x,y) represents the required development time from the top of the resist to the bottom of the resist at each lateral position (x,y), if the required development time of a particular lateral position (x,y) is greater than the particular development time $t_{dev}$, the lateral position (x,y) will not be developed (See for example lateral position ($x_5,y_1$) of FIGS. 7 and 9. Otherwise, if the required development time of a particular lateral position (x,y) is less than the development time $t_{dev}$ that lateral position (x,y) will be developed (See for example lateral position ($x_6,y_1$) of FIGS. 8 and 9). Thus, the lateral positions (x,y) of points of the resulting resist feature 900 can be determined, resulting in a contour of the resist feature as shown in the plan view of FIG. 9.

In the illustrated embodiment the resist is a positive resist and thus the portion of the resist that is developed will be removed in the resulting image of FIG. 9. It will be understood that the present invention can also be used with a negative resist in which the portion of the resist that is developed remains, and the undeveloped portions are removed.

Referring back to FIGS. 7 and 8, the time development function t(x,y) at lateral positions ($x_1,y_1$), ($x_2,y_1$), ($x_3,y_2$), and ($x_4,y_2$) have a development time substantially matching the particular development time $t_{dev}$. Thus, as can be seen in FIG. 9 the lateral positions ($x_1,y_1$), ($x_2,y_1$), ($x_3,y_2$), and ($x_4,y_2$) are a set of edge points of the resist feature 900. As used herein, a lateral position (x,y) adjacent the intersection of the particular development time $t_{dev}$ and the development time function t(x,y) has a development time "substantially matching" the particular development time $t_{dev}$.

Once the resulting feature 900 is determined, additional computations can be made to apply OPC or other resolution enhancement techniques to adjust (if necessary) the designed feature 300 on the mask (block 270) based on the lateral positions of the resulting feature 900 in order to increase the fidelity with which the designed feature 300 can then ultimately be formed on the wafer. In some embodiments the resulting feature 900 and the designed feature 300 may be overlayed and displayed using a user interface output device (See FIG. 12, reference number 1220).

As mentioned above, the weighting function c(z) used in the development time function t(x,y) is empirically determined and is also independent of lateral position (x,y). As described in more detail below, the weighting function c(z) can be determined using data obtained from manufactured test features formed by a lithographic process having an actual development time $t_{actual}$. An optical model of the lithographic process simulates the test patterns on the mask to compute the projected image intensity values I(x,y,z) in the resist.

The lateral position (x,y) of edges of the manufactured test patterns are then measured, for example, by using a scanning electron microscope (SEM). These lateral positions (x,y) of the edges of the manufactured test patterns thus have a development time substantially matching the actual development time $t_{actual}$ used in the manufacturing of the test patterns. Thus, by using the image intensity values I(x,y,z) at lateral position (x,y) of these edge values in the development time equation t(x,y), and setting the development time equation equal to the actual development time $t_{actual}$, and the weighting function c(z) can be solved.

For example, for an embodiment in which the development time function is computed using the following equation:

$$t(x, y) = \sum_{i=0}^{n} \frac{(Z_T/n)}{c(z_i)[I(x, y, z_i)]^\gamma}$$

the lateral position (x,y) of edges of the test patterns can be measured using an SEM. The simulated image intensity values $I(x,y,z_i)$ at the lateral position (x,y) of the edges of the test patterns can be obtained using an optical model as described above. Since the lateral positions (x,y) of the edges of the test patterns have a development time substantially matching the actual development time $t_{actual}$, using the image intensity values $I(x,y,z_i)$ at the lateral positions (x,y) of these edge values in t(x,y), and setting t(x,y) equal to $t_{actual}$, results in a set of linear equations which can be used to solve for $c(z_i)$.

In the illustrated embodiment of FIGS. 2-9 the resist development model is used to predict the lateral positions of a resist feature, although the present invention is not limited as such.

For example, in alternative embodiments the resist model described herein can be used to predict lateral position information about feature in the underlying layer 420 (See FIG. 4) using a resist feature as an etch mask. In such an embodiment, the weighting function c(z) can be empirically determined by an optical model simulating the image of the test patterns projected onto the resist to provide the image intensity values I(x,y,z) in the resist. SEM measurements can be used to determine the lateral position (x,y) of edges of the etched features in the layer 420 formed using the resist features as an etch mask. The lateral positions (x,y) of these edges have a development time substantially matching the actual development time $t_{actual}$. Next, the development time function t(x,y) is set equal to $t_{actual}$ to form a set of linear equations which can be solved to determine the weighting function c(z). In such an embodiment the weighting function c(z) will incorporate etch effects as well as complex resist behavior.

Measured Results

Figure 10A:
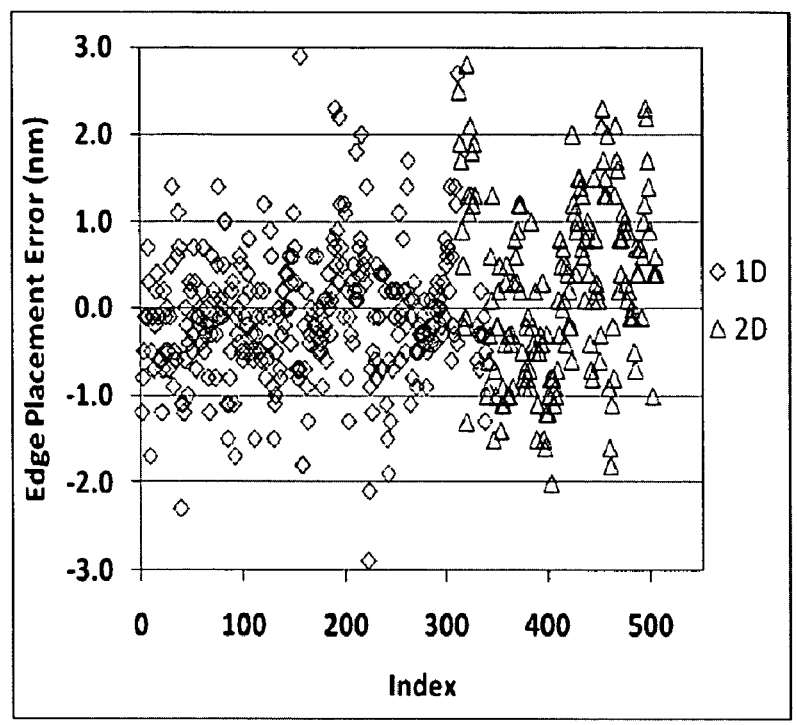
FIGS. 10A and 10B illustrate test pattern edge placement errors for a traditional variable resist model and for the resist model as described herein.
Figure 10B:
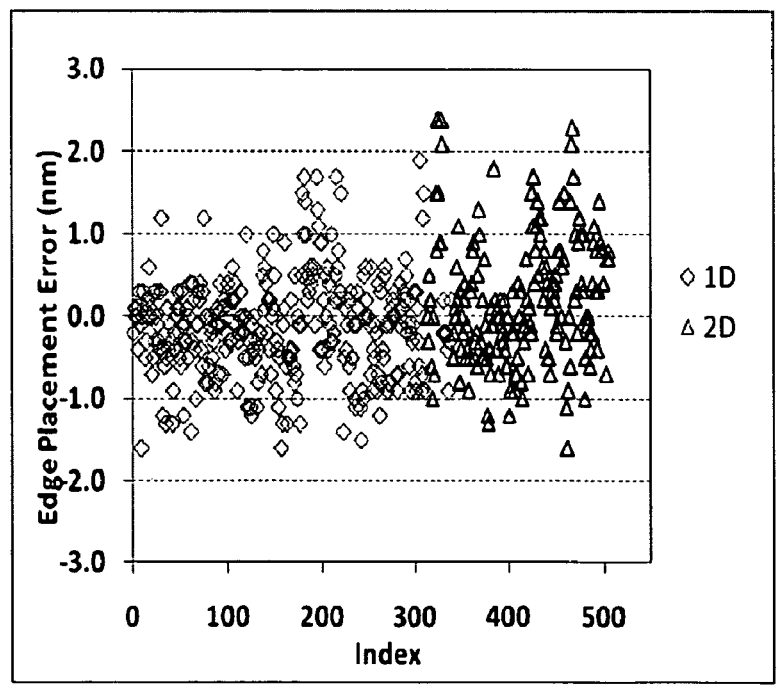
Figures 11A, 11B:
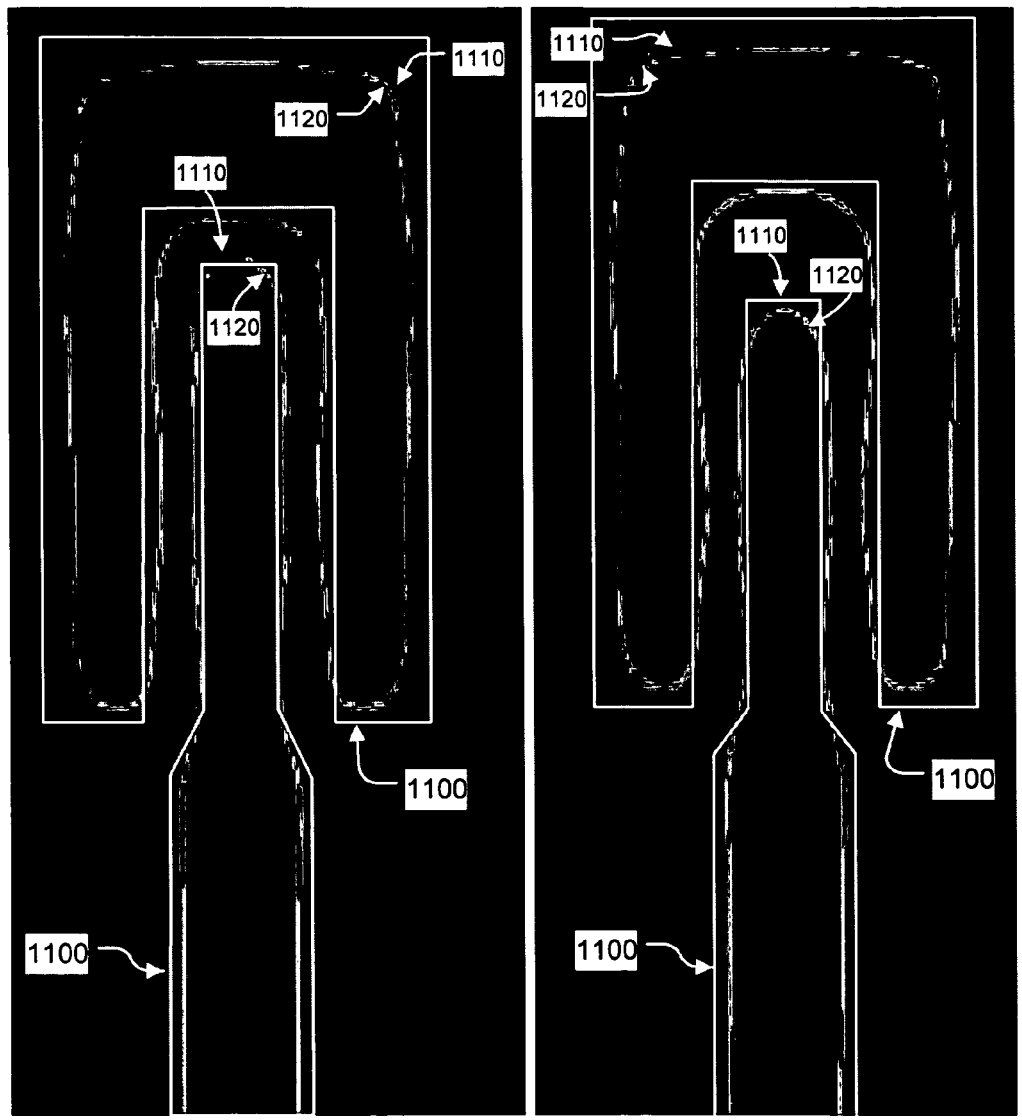
FIGS. 11A-11D are scanning electron microscope images of various test patterns illustrating the improved accuracy of the present invention at predicting the resultant developed resist feature.
Figure 11C:
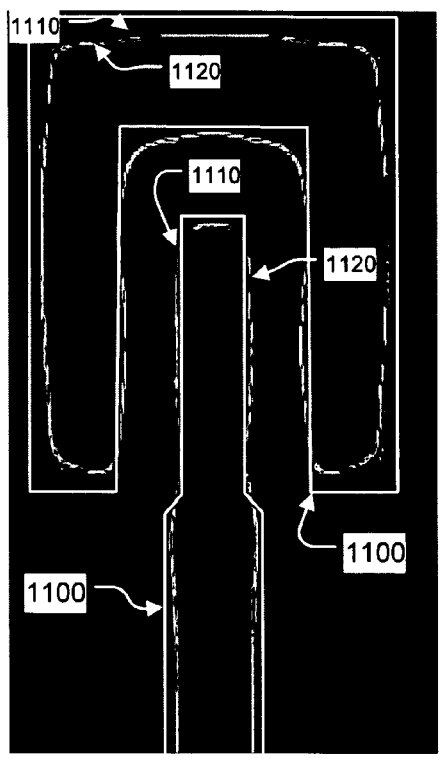
Figure 11D:
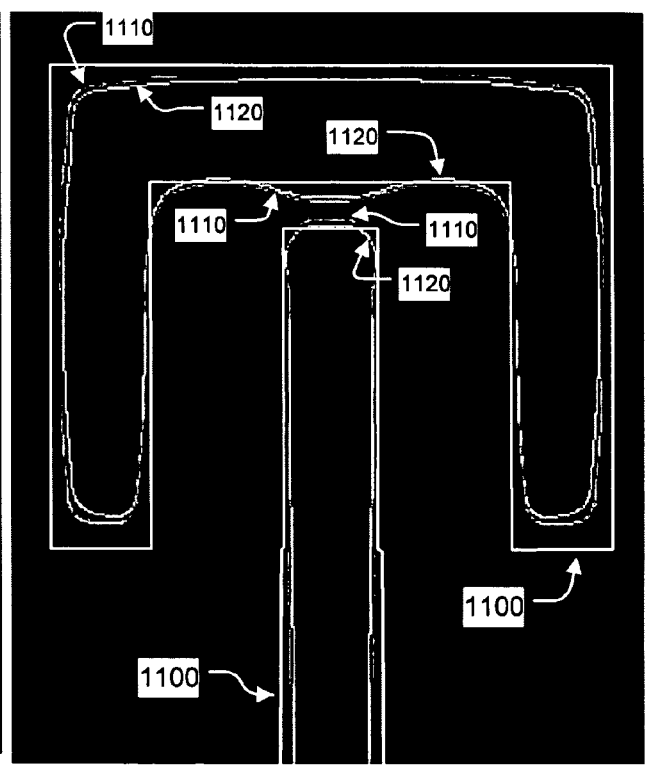

The table below summarizes the edge placement error (EPE) of test patterns using a traditional threshold resist model compared to the resist model described herein, and FIGS. 10A and 10B illustrate the EPE of sample points for the traditional threshold resist model and the resist model described herein respectively. EPE is the difference between the predicted edge placement and the actual edge placement of the test patterns. 1D is the distance between the edges along the long dimension of adjacent lines, and 2D is the distance between the ends of adjacent lines. As can be seen in the table below and in FIGS. 10A-10B, the present invention is more accurate than traditional threshold resist models.

|  | Traditional | Bulk Image Modeling |
|---|---|---|
| 1D Sigma | 1.48 nm | 1.23 nm |
| 2D Sigma | 1.92 nm | 1.54 nm |
| All Sigma | 1.70 nm | 1.38 nm |

FIGS. 11A-11D are scanning electron microscope (SEM) images of various test patterns. The lines 1100 overlaying the test patterns are the actual masks, and the gray shaded regions indicate the resultant developed photoresist pattern. The lines 1110 overlaying the test patterns are the predicted developed photoresist pattern using the traditional threshold resist model, and the lines 1120 overlaying the test patterns are the predicted developed photoresist pattern using the method described herein. As can be seen in the test patterns of FIGS. 11A-11D, the present invention is more accurate than traditional threshold resist models.

As will be understood, the methods described herein may be implemented in software stored in memory and executed by a general purpose computer, or in other memory that can be distributed separately from the computer system, and an article of manufacture.

Figure 12:
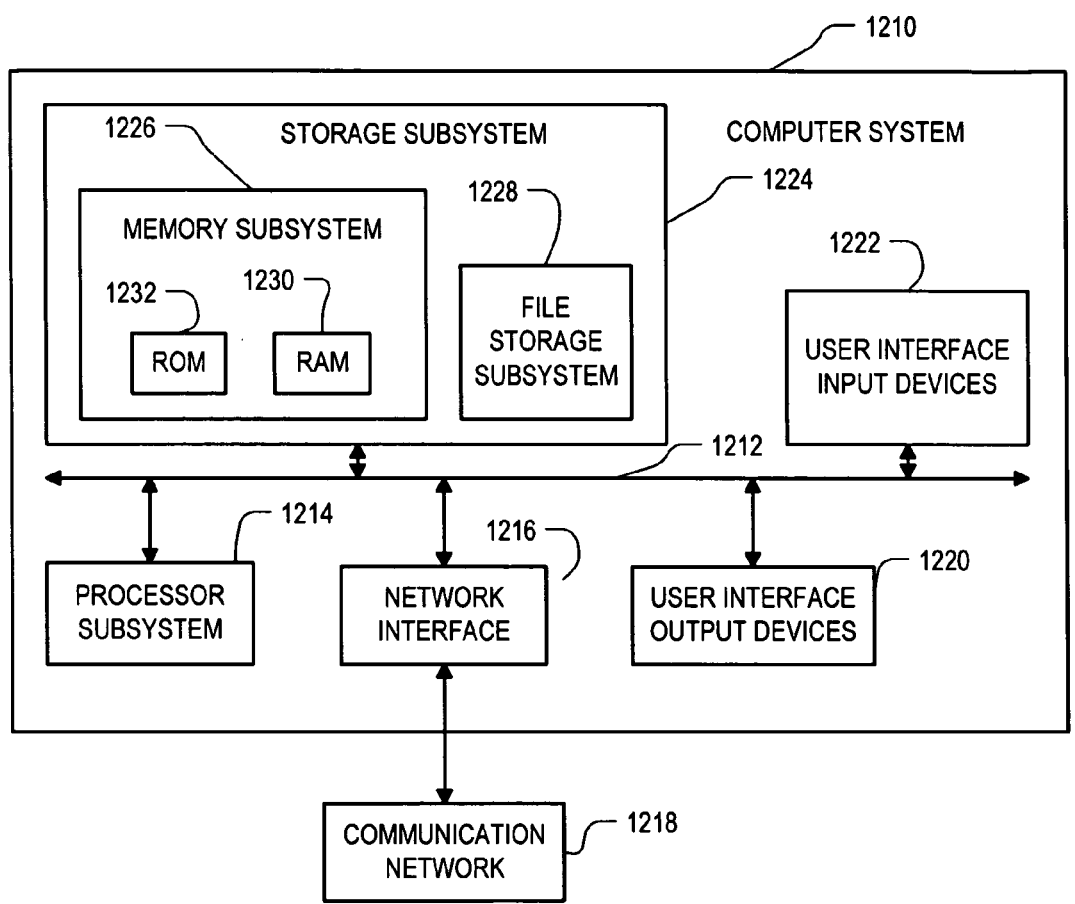
FIG. 12 is a simplified block diagram of a computer system that can be used to implement software incorporating aspects of the present invention.

FIG. 12 is a simplified block diagram of a computer system 1210 that can be used to implement software incorporating aspects of the present invention. While the flow chart figures set forth herein describe series of steps, it will be appreciated that each step of the flow chart or algorithm can be implemented by causing a computer system such as 1210 to operate in a specified manner.

Computer system 1210 typically includes a processor subsystem 1214 which communicates with a number of peripheral devices via bus subsystem 1212. Processor subsystem 1214 may contain one or a number of processors. The peripheral devices may include a storage subsystem 1224, comprising a memory subsystem 1226 and a file storage subsystem 1228, user interface input devices 1222, user interface output devices 1220, and a network interface subsystem 1216. The input and output devices allow user interaction with computer system 1210. Network interface subsystem 1216 provides an interface to outside networks, including an interface to communication network 1218, and is coupled via communication network 1218 to corresponding interface devices in other computer systems. Communication network 1218 may comprise many interconnected computer systems and communication links. These communication links may be wireline links, optical links, wireless links, or any other mechanisms for communication of information. While in one embodiment, communication network 1218 is the Internet, in other embodiments, communication network 1218 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells on a single integrated circuit chip with other components of the computer system.

User interface input devices 1222 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 1210 or onto computer network 1218.

User interface output devices 1220 may include a display subsystem, a printer, a fax machine, or non visual displays such as audio output devices. The display subsystem may include a cathode ray tube (CRT), a flat panel device such as a liquid crystal display (LCD), a projection device, or some other mechanism for creating a visible image. The display subsystem may also provide for non visual display such as via audio output devices. In general, use of the term "output device" is intended to include all possible types of devices and ways to output information from computer system 1210 to the user or to another machine or computer system.

Storage subsystem 1224 stores the basic programming and data constructs that provide the functionality of certain embodiments of the present invention. For example, the various modules implementing the functionality of certain embodiments of the invention may be stored in storage subsystem 1224. These software modules are generally executed by processor subsystem 1214.

Memory subsystem 1226 typically includes a number of memories including a main random access memory (RAM) 1230 for storage and instructions and data during program execution and a read only memory (ROM) 1232 in which fixed instructions are stored. File storage subsystem 1228 provides persistent storage for program and data files, and may include a hard disk drive, a floppy disk drive along with associated removable media, a CD ROM drive, an optical drive, or removable media cartridges. The databases and modules implementing the functionality of certain embodiments of the invention may have been provided on a computer readable medium such as one or more CD-ROMs, and may be stored by file storage subsystems 1228. The host memory 1226 contains, among other things, computer instructions such as program code which, when executed by the processor subsystem 1214, cause the computer system to operate or perform functions as described herein. As used herein, processes and software that are said to run in or on "the host" or "the computer", execute on the processor subsystem 1214 in response to computer instructions and data in the host memory subsystem 1226 including any other local or remote storage for such instructions and data.

Bus subsystem 1212 provides a mechanism for letting the various components and subsystems of computer system 1210 communicate with each other as intended. Although bus subsystem 1212 is shown schematically as a single bus, alternative embodiments of the bus subsystem may use multiple busses.

Computer system 1210 itself can be of varying types including a personal computer, a portable computer, a workstation, a computer terminal, a network computer, a television, a mainframe, or any other data processing system or user device. Due to the ever changing nature of computers and networks, the description of computer system 1210 depicted in FIG. 12 is intended only as a specific example for purposes of illustrating the preferred embodiments of the present invention. Many other configurations of computer system 1210 are possible having more or less components than the computer system depicted in FIG. 12.

The present invention may be practiced as a method or device adapted to practice the method. The invention may be an article of manufacture such as a media impressed with logic to carry out the steps of the method when executed by a computer.

As used herein, a given signal, event or value is "responsive" to a predecessor signal, event or value if the predecessor signal, event or value influenced the given signal, event or value. If there is an intervening processing element, step or time period, the given signal, event or value can still be "responsive" to the predecessor signal, event or value. If the intervening processing element or step combines more than one signal, event or value, the signal output of the processing element or step is considered "responsive" to each of the signal, event or value inputs. If the given signal, event or value is the same as the predecessor signal, event or value, this is merely a degenerate case in which the given signal, event or value is still considered to be "responsive" to the predecessor signal, event or value. "Dependency" of a given signal, event or value upon another signal, event or value is defined similarly.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in the art. While the present invention has been described by reference to preferred embodiments and examples detailed above, it is understood that these examples are intended in an illustrative rather than in a limiting sense. Computer-assisted processing may be used to implement the described embodiments. Accordingly, the present invention may be embodied in methods for performing the specified steps, systems including logic and resources to carry out the specified steps, media impressed with logic to carry out the specified steps, data streams impressed with logic to carry out the specified steps, or computer-accessible services that carry out the specified steps. It is contemplated that modifications and combinations will readily occur to those skilled in the art, which modifications and combinations will be within the spirit of the invention and the scope of the following claims.

What is claimed is:

1. A method for predicting lateral position information about a feature represented in an integrated circuit layout, during the making of an integrated circuit using a fabrication process which projects an image onto a resist, the method comprising:

providing a lateral distribution of intensity values of the image at different depths within the resist; and using a computer, predicting a lateral position of an edge point of the feature in dependence upon a particular resist development time, and further in dependence upon the intensity values at more than one depth within the resist.

2. The method of claim 1, wherein the feature is a resist feature.

3. The method of claim 1, wherein the feature is a feature in a layer underlying the resist.

4. The method of claim 1, wherein the step of predicting comprises:

estimating a required development time of the resist at a plurality of laterally distributed points in dependence upon the intensity values at points in the plurality at more than one depth within the resist; and predicting the lateral position of the edge point as a point in the plurality where the required development time substantially matches the particular resist development time.

5. The method of claim 4, wherein the step of estimating comprises estimating the required development time of the resist at a particular point in the plurality in dependence upon a plurality of intensity values of the image at more than one depth within the resist and at the lateral position of the particular point.

6. The method of claim 5, wherein the step of estimating the required development time of the resist at a particular point has a result described by $$t(x, y) = \int_0^{Z_T} \frac{dz}{c(z)f(I(x, y, z))}$$

wherein (x,y) is the lateral position of the particular point, t(x,y) is the required development time at the particular point, $Z_T$ is a thickness of the resist at the particular point, f(I(x,y,z)) is a development rate function dependent upon the intensity value I(x,y,z) at the particular point at different depths (z) within the resist, and c(z) is a weighting function independent of the lateral position (x,y) of the particular point.

7. The method of claim 6, wherein the development rate function f(I(x,y,z)) has a result described by $$f(I(x,y,z)) = [I(x,y,z)]^\gamma$$

wherein γ is a constant.

8. The method of claim 5, wherein the step of estimating the required development time of the resist at a particular point has a result described by $$t(x, y) = \sum_{i=0}^{n} \frac{(Z_T/n)}{c(z_i)f(I(x, y, z_i))}$$

wherein (x,y) is the lateral position of the particular point, t(x,y) is the required development time at the particular point, $Z_T$ is a thickness of the resist at the particular point, $f(I(x,y,z_i))$ is a development rate function dependent upon the intensity value $I(x,y,z_i)$ at the particular point at each of (n+1) different depths $(z_i)$ within the resist, and c(z) is a weighting function independent of the lateral position (x,y) of the particular point.

9. The method of claim 8, wherein the development rate function $f(I(x,y,z_i))$ has a result described by $$f(I(x,y,z_i)) = [I(x,y,z_i)]^\gamma$$

wherein γ is a constant.

10. The method of claim 1, further comprising predicting respective lateral positions of a set of points of the feature in dependence upon the particular resist development time, and further in dependence upon the intensity values at more than one depth within the resist, the set of points of the feature including the edge point.

11. The method of claim 10, wherein the step of predicting respective lateral positions of a set of points of the feature comprises:
estimating a required development time of the resist at a plurality of laterally-distributed points in dependence upon the intensity values at points in the plurality at more than one depth within the resist; and
predicting the respective lateral positions of the set of points of the feature as points in the plurality where the required development time is less than or substantially matches the particular resist development time.

12. The method of claim 11, wherein the step of estimating comprises estimating the required development time of the resist at a particular point in the plurality in dependence upon a plurality of intensity values all at the lateral position of the particular point and at more than one depth within the resist.

13. The method of claim 12, wherein the step of estimating the required development time of the resist at a particular point has a result described by $$t(x, y) = \int_0^{Z_T} \frac{dz}{c(z)f(I(x, y, z))}$$

wherein (x,y) is the lateral position of the particular point, t(x,y) is the required development time at the particular point, $Z_T$ is a thickness of the resist at the particular point, f(I(x,y,z)) is a development rate function dependent upon the intensity value I(x,y,z) at the particular point at different depths (z) within the resist, and c(z) is a weighting function independent of the lateral position (x,y) of the particular point.

14. The method of claim 13, wherein the development rate function f(I(x,y,z)) has a result described by $$f(I(x,y,z)) = [I(x,y,z)]^\gamma$$

wherein γ is a constant.

15. The method of claim 12, wherein the step of estimating the required development time of the resist at a particular point has a result described by $$t(x, y) = \sum_{i=0}^{n} \frac{(Z_T/n)}{c(z_i)f(I(x, y, z_i))}$$

wherein (x,y) is the lateral position of the particular point, t(x,y) is the required development time at the particular point, $Z_T$ is a thickness of the resist at the particular point, $f(I(x,y,z_i))$ is a development rate function dependent upon the intensity value I(x,y,z) at the particular point at each of (n+1) different depths $(z_i)$ within the resist, and c(z) is a weighting function independent of the lateral position (x,y) of the particular point.

16. The method of claim 15, wherein the development rate function $f(I(x,y,z_i))$ has a result described by $$f(I(x,y,z_i)) = [I(x,y,z_i)]^\gamma$$

wherein γ is a constant.

17. The method of claim 1, further comprising predicting respective lateral positions of a set of points along an edge of the feature in dependence upon the particular resist development time, and further in dependence upon the intensity values at more than one depth with the resist, the set of points along the edge of the feature including the edge point.

18. The method of claim 1, further comprising adjusting a designed feature represented in a mask layout based on the predicted lateral position of the edge point of the feature.

19. A system for predicting lateral position information about a feature represented in an integrated circuit layout, during the making of an integrated circuit using a fabrication process which projects an image onto a resist, the system comprising:
a data processor;
a storage subsystem; and
program code which when executed by the data processor performs the steps of:
providing a lateral distribution of intensity values of the image at different depths within the resist; and
predicting a lateral position of an edge point of the feature in dependence upon a particular resist development time, and further in dependence upon the intensity values at more than one depth within the resist.

20. The system of claim 19, wherein the feature is a resist feature.

21. The system of claim 19, wherein the feature is a feature in a layer underlying the resist.

22. The system of claim 19, wherein the step of predicting comprises:
estimating a required development time of the resist at a plurality of laterally distributed points in dependence upon the intensity values at points in the plurality at more than one depth within the resist; and
predicting the lateral position of the edge point as a point in the plurality where the required development time substantially matches the particular resist development time.

23. The system of claim 22, wherein the step of estimating comprises estimating the required development time of the resist at a particular point in the plurality in dependence upon a plurality of intensity values of the image at more than one depth within the resist and at the lateral position of the particular point.

24. The system of claim 23, wherein the step of estimating the required development time of the resist at a particular point has a result described by $$t(x, y) = \int_0^{Z_T} \frac{dz}{c(z)f(I(x, y, z))}$$

wherein (x,y) is the lateral position of the particular point, t(x,y) is the required development time at the particular point, $Z_T$ is a thickness of the resist at the particular point, f(I(x,y,z)) is a development rate function dependent upon the intensity values at the particular point at different depths (z) within the resist, and c(z) is a weighting function independent of the lateral position (x,y) of the particular point.

25. The system of claim 24, wherein the development rate function f(I(x,y,z)) has a result described by $$f(I(x,y,z))=[I(x,y,z)]^\gamma$$

wherein γ is a constant.

26. The system of claim 23, wherein the step of estimating the required development time of the resist at a particular point has a result described by $$t(x, y) = \sum_{i=0}^{n} \frac{(Z_T/n)}{c(z_i)f(I(x, y, z_i))}$$

wherein (x,y) is the lateral position of the particular point, t(x,y) is the required development time at the particular point, $Z_T$ is a thickness of the resist at the particular point, $f(I(x,y,z_i))$ is a development rate function dependent upon the intensity values at the particular point at each of (n+1) different depths ($z_i$) within the resist, and c(z) is a weighting function independent of the lateral position (x,y) of the particular point.

27. The system of claim 26, wherein the development rate function $f(I(x,y,z_i))$ has a result described by $$f(I(x,y,z_i))=[I(x,y,z_i)]^\gamma$$

wherein γ is a constant.

28. The system of claim 19, wherein the program code which when executed by the data processor further performs the step of predicting respective lateral positions of a set of points of the feature in dependence upon the particular resist development time, and further in dependence upon the intensity values at more than one depth within the resist, the set of points of the feature including the edge point.

29. The system of claim 28, wherein the step of predicting respective lateral positions of a set of points of the feature comprises:
estimating a required development time of the resist at a plurality of laterally-distributed points in dependence upon the intensity values at points in the plurality at more than one depth within the resist; and
predicting the respective lateral positions of the set of points of the feature as points in the plurality where the required development time is less than or substantially matches the particular resist development time.

30. The system of claim 29, wherein the step of estimating comprises estimating the required development time of the resist at a particular point in the plurality in dependence upon a plurality of intensity values all at the lateral position of the particular point and at more than one depth within the resist.

31. The system of claim 30, wherein the step of estimating the required development time of the resist at a particular point has a result described by $$t(x, y) = \int_0^{Z_T} \frac{dz}{c(z)f(I(x, y, z))}$$

wherein (x,y) is the lateral position of the particular point, t(x,y) is the required development time at the particular point, $Z_T$ is a thickness of the resist at the particular point, f(I(x,y,z)) is a development rate function dependent upon the intensity values at the particular point at different depths (z) within the resist, and c(z) is a weighting function independent of the lateral position (x,y) of the particular point.

32. The system of claim 31, wherein the development rate function f(I(x,y,z)) has a result described by $$f(I(x,y,z))=[I(x,y,z)]^\gamma$$

wherein γ is a constant.

33. The system of claim 30, wherein the step of estimating the required development time of the resist at a particular point has a result described by $$t(x, y) = \sum_{i=0}^{n} \frac{(Z_T/n)}{c(z_i)f(I(x, y, z_i))}$$

wherein (x,y) is the lateral position of the particular point, t(x,y) is the required development time at the particular point, $Z_T$ is a thickness of the resist at the particular point, $f(I(x,y,z_i))$ is a development rate function dependent upon the intensity values at the particular point at each of (n+1) different depths ($z_i$) within the resist, and c(z) is a weighting function independent of the lateral position (x,y) of the particular point.

34. The system of claim 33, wherein the development rate function $f(I(x,y,z_i))$ has a result described by $$f(I(x,y,z_i))=[I(x,y,z_i)]^\gamma$$

wherein γ is a constant.

35. The system of claim 19, wherein the program code which when executed by the data processor further performs the step of predicting respective lateral positions of a set of points along an edge of the feature in dependence upon the particular resist development time, and further in dependence upon the intensity values at more than one depth with the resist, the set of points along the edge of the feature including the edge point.

36. The system of claim 19, wherein the program code which when executed by the data processor further performs the step of adjusting a designed feature represented in a mask layout based on the predicted lateral position of the edge point of the feature.

37. A non-transitory computer readable medium storing computer instructions to perform a method for predicting lateral position information about a feature represented in an integrated circuit layout, during the making of an integrated circuit using a fabrication process which projects an image onto a resist, the method comprising:
providing a lateral distribution of intensity values of the image at different depths within the resist; and
predicting a lateral position of an edge point of the feature in dependence upon a particular resist development time, and further in dependence upon the intensity values at more than one depth within the resist.

38. The non-transitory computer readable medium of claim 37, wherein the feature is a resist feature.

39. The non-transitory computer readable medium of claim 37, wherein the feature is a feature in a layer underlying the resist.

40. The non-transitory computer readable medium of claim 37, wherein the step of predicting comprises:
estimating a required development time of the resist at a plurality of laterally distributed points in dependence upon the intensity values at points in the plurality at more than one depth within the resist; and
predicting the lateral position of the edge point as a point in the plurality where the required development time substantially matches the particular resist development time.

41. The non-transitory computer readable medium of claim 40, wherein the step of estimating comprises estimating the required development time of the resist at a particular point in the plurality in dependence upon a plurality of intensity values of the image at more than one depth within the resist and at the lateral position of the particular point.

42. The non-transitory computer readable medium of claim 41, wherein the step of estimating the required development time of the resist at a particular point has a result described by $$t(x, y) = \int_0^{Z_T} \frac{dz}{c(z)f(I(x, y, z))}$$

wherein (x,y) is the lateral position of the particular point, t(x,y) is the required development time at the particular point, $Z_T$ is a thickness of the resist at the particular point, f(I(x,y,z)) is a development rate function dependent upon the intensity value I(x,y,z) at the particular point at different depths (z) within the resist, and c(z) is a weighting function independent of the lateral position (x,y) of the particular point.

43. The non-transitory computer readable medium of claim 42, wherein the development rate function f(I(x,y,z)) has a result described by $$f(I(x, y, z)) = [I(x, y, z)]^\gamma$$

wherein y is a constant.

44. The non-transitory computer readable medium of claim 41, wherein the step of estimating the required development time of the resist at a particular point has a result described by $$t(x, y) = \sum_{i=0}^{n} \frac{(Z_T/n)}{c(z_i)f(I(x, y, z_i))}$$

wherein (x,y) is the lateral position of the particular point, t(x,y) is the required development time at the particular point, $Z_T$ is a thickness of the resist at the particular point, $f(I(x,y,z_i))$ is a development rate function dependent upon the intensity value $I(x,y,z_i)$ at the particular point at each of (n+1) different depths ($z_i$) within the resist, and c(z) is a weighting function independent of the lateral position (x,y) of the particular point.

45. The non-transitory computer readable medium of claim 44, wherein the development rate function $f(I(x,y,z_i))$ has a result described by $$f(I(x, y, z_i)) = [I(x, y, z_i)]^\gamma$$

wherein y is a constant.

46. The non-transitory computer readable medium of claim 37, wherein the method further comprises predicting respective lateral positions of a set of points of the feature in dependence upon the particular resist development time, and further in dependence upon the intensity values at more than one depth within the resist, the set of points of the feature including the edge point.

47. The non-transitory computer readable medium of claim 46, wherein the step of predicting respective lateral positions of a set of points of the feature comprises:
estimating a required development time of the resist at a plurality of laterally-distributed points in dependence upon the intensity values at points in the plurality at more than one depth within the resist; and
predicting the respective lateral positions of the set of points of the feature as points in the plurality where the required development time is less than or substantially matches the particular resist development time.

48. The non-transitory computer readable medium of claim 47, wherein the step of estimating comprises estimating the required development time of the resist at a particular point in the plurality in dependence upon a plurality of intensity values all at the lateral position of the particular point and at more than one depth within the resist.

49. The non-transitory computer readable medium of claim 48, wherein the step of estimating the required development time of the resist at a particular point has a result described by $$t(x, y) = \int_0^{Z_T} \frac{dz}{c(z)f(I(x, y, z))}$$

wherein (x,y) is the lateral position of the particular point, t(x,y) is the required development time at the particular point, $Z_T$ is a thickness of the resist at the particular point, f(I(x,y,z)) is a development rate function dependent upon the intensity value I(x,y,z) at the particular point at different depths (z) within the resist, and c(z) is a weighting function independent of the lateral position (x,y) of the particular point.

50. The non-transitory computer readable medium of claim 49, wherein the development rate function $f(I(x,y,z))$ has a result described by $$f(I(x, y, z)) = [I(x, y, z)]^\gamma$$

wherein $\gamma$ is a constant.

51. The non-transitory computer readable medium of claim 48, wherein the step of estimating the required development time of the resist at a particular point has a result described by $$t(x, y) = \sum_{i=0}^{n} \frac{(Z_T/n)}{c(z_i)f(I(x, y, z_i))}$$

wherein (x,y) is the lateral position of the particular point, t(x,y) is the required development time at the particular point, $Z_T$ is a thickness of the resist at the particular point, $f(I(x,y,z_i))$ is a development rate function dependent upon the intensity value I(x,y,z) at the particular point at each of (n+1) different depths ($z_i$) within the resist, and c(z) is a weighting function independent of the lateral position (x,y) of the particular point.

52. The non-transitory computer readable medium of claim 51, wherein the development rate function $f(I(x,y,z_i))$ has a result described by $$f(I(x, y, z_i)) = [I(x, y, z_i)]^\gamma$$

wherein $\gamma$ is a constant.

53. The non-transitory computer readable medium of claim 37, wherein the method further comprises predicting respective lateral positions of a set of points along an edge of the feature in dependence upon the particular resist development time, and further in dependence upon the intensity values at more than one depth with the resist, the set of points along the edge of the feature including the edge point.

54. The non-transitory computer readable medium of claim 37, wherein the method further comprises adjusting a designed feature represented in a mask layout based on the predicted lateral position of the edge point of the feature.

* * * * *